United States Patent
Bogdahn et al.

(10) Patent No.: US 7,006,552 B2
(45) Date of Patent: Feb. 28, 2006

(54) RESISTANCE FURNACE WITH TUBULAR HEATING ELEMENT

(75) Inventors: Thomas Bogdahn, Karlstein (DE); Oliver Ganz, Bruchköbel (DE)

(73) Assignee: Heraeus Tenevo GmbH, Hanau (DE)

( * ) Notice: Subject to any disclaimer, the term of this patent is extended or adjusted under 35 U.S.C. 154(b) by 0 days.

(21) Appl. No.: 10/502,485

(22) PCT Filed: Jan. 24, 2002

(86) PCT No.: PCT/EP02/00663
§ 371 (c)(1),
(2), (4) Date: Jul. 23, 2004

(87) PCT Pub. No.: WO03/062727
PCT Pub. Date: Jul. 31, 2003

(65) Prior Publication Data
US 2005/0069015 A1 Mar. 31, 2005

(51) Int. Cl.
*F27D 7/06* (2006.01)
(52) U.S. Cl. .................................... 373/111; 373/125
(58) Field of Classification Search ........ 373/109–115, 373/117–131, 134–137; 219/406, 408, 427, 219/553; 432/94, 253
See application file for complete search history.

(56) References Cited

U.S. PATENT DOCUMENTS

| | | | | |
|---|---|---|---|---|
| 715,509 A | * | 12/1902 | Potter | 373/126 |
| 1,023,309 A | * | 4/1912 | Helberger | 373/119 |
| 2,121,744 A | | 6/1938 | Ridgway et al. | |
| 3,139,474 A | | 6/1964 | Weech et al. | |
| 3,170,018 A | * | 2/1965 | Lewis | 373/112 |
| 4,549,345 A | | 10/1985 | Wilsey | |
| 4,703,556 A | | 11/1987 | Wilsey | |
| 5,864,576 A | * | 1/1999 | Nakatani et al. | 373/125 |

FOREIGN PATENT DOCUMENTS

FR 500 555 A 3/1920

* cited by examiner

*Primary Examiner*—Tu Hoang
(74) *Attorney, Agent, or Firm*—Tiajoloff & Kelly

(57) ABSTRACT

A resistance furnace has a tubular heating element with a vertically-oriented longitudinal axis. The heating element has a shell surface defined by an upper side and a lower side and surrounding a furnace chamber. The heating element is connected to at least two supply terminals by which heating current is introduced at power supply points into the heating element. The supply terminals include a surrounding upper annular collar adjacent the upper side of the shell surface, and also a surrounding lower annular collar adjacent the lower side of the shell surface.

42 Claims, 2 Drawing Sheets

RESISTANCE FURNACE WITH TUBULAR HEATING ELEMENT

FIELD OF THE INVENTION

The present invention relates to a resistance furnace comprising a tubular heating element having a vertically oriented longitudinal axis, the element comprising a shell surface defined by an upper side and a lower side and surrounding a furnace chamber, and the element being connected to supply terminals by means of which heating current is introduced into the heating element at power supply points.

BACKGROUND OF THE INVENTION

High temperatures can be achieved with the help of resistance furnaces. Electrical current flows through an ohmic resistor designed as a heat conductor, the electrical power being mainly converted into heat. Metal, such as molybdenum, tantalum, and platinum, ceramics, SiC, or modifications of carbon, such as coal, graphite or vitreous carbon (pyrolytically produced carbon) are suited as a material for the heat conductor. Heat conductors of graphite are characterized by their high temperature resistance, simple shape and low price.

Resistance furnaces are e.g. used for melting semiconductor material, or for heating rod-like or tubular start cylinders to elongate tubes, rods or optical fibers therefrom. Apart from special cases in which a purposefully inhomogeneous heating capacity is desired (e.g. during drawing of cylinders having a polygonal cross-section), the main emphasis is normally laid on a uniform heating of the heating material.

The local heating capacity is directly proportional to the current density, the latter being defined by the current flow and the cross-sectional area and the specific resistance of the material of the heat conductor. The specific resistance, in turn, depends on the local temperature. The relatively low conductivity of the heat conductor materials and the accompanying voltage drop make it difficult to produce and maintain a homogeneous temperature profile.

U.S. Pat. No. 4,703,556 therefore suggests a furnace having a heating tube of graphite, in which a plurality of axially extending longitudinal slots are distributed over the circumference of the heating tube and extend in alternating fashion from above and from below over almost the whole heating tube height. Thus, electricity flows through the remaining webs of the heating tube in meander-like fashion. This results in a homogenization of the temperature curve in vertical direction.

A further homogenization of the current density within the heating tube is accomplished by the measure that two graphite connection pieces are provided for the supply of heating current, said pieces being screwed in the area of the bottom side of the heating tube to opposite places and being fed via separate transformers. The voltage drop can be counteracted by the second power supply point over the entire length of the heating tube webs, resulting in an improved vertical and horizontal homogeneity of the current and temperature distribution.

It is however very complicated to produce the known heating tube. Due to its filigree shape it is prone to mechanical damage and must therefore be replaced frequently. Moreover, due to scaling and oxidation in the region of the supply terminals there might be a deterioration of the electrical contact and an undefined power supply and thus an irregular heating operation and temperature distribution over the heating tube. This risk is enhanced by the fact that the supply terminals are located directly next to the zone with the maximum temperature load.

In high-performance resistance furnaces (above about 100 kW), temperature sinks are particularly noticed and make it more and more difficult to adjust and maintain a homogeneous temperature distribution.

SUMMARY OF THE INVENTION

It is the object of the present invention to provide an electric resistance furnace, in particular a high-performance resistance furnace which is characterized by small manufacturing and maintenance efforts and by a high operational reliability, and which permits the reproducible adjustment of an axially and radially homogeneous temperature profile within the furnace.

Starting from the above-mentioned resistance furnace, this object is achieved according to the invention in that the supply terminals comprise a surrounding upper annular collar of metal in the region of the upper side and a surrounding lower annular collar of metal in the region of the lower side.

Heating current is introduced into the heating element via the annular collars. To this end one annular collar is provided at the upper front end and one annular collar at the lower front end of the heating element. The annular collars are in contact with the respective front side of the tubular heating elements with which the inner jacket and/or the outer jacket are in contact, the contact portion being preferably designed in planar fashion, in the simplest case as an annular contact surface between annular collar and heating element. The annular collars are made from one piece or are composed of individual members.

For the supply of the heating current into the respective annular collar, said collars are each provided with at least one current terminal. The at least one current terminal of the annular collars will also be designated in the following as an "electrode terminal".

The component of the resistance furnace supplied with heating current is here understood as the heating element. It may be made integral or may be composed of a plurality of members.

The annular collars are made from a metal of high electrical conductivity, so that a horizontal voltage drop that is as small as possible is achieved when viewed over the circumference thereof. Since the annular collars are provided both on the upper side and the lower side of the heating element and current is thereby supplied to the heating element from two sides, there is also a reduced vertical voltage drop over the height of the heating element in comparison with a current supply from only one side. This results in a homogeneity of the current and temperature distribution that is improved on the whole.

Especially with respect to a homogeneous horizontal distribution of the current power density within the heating element, it has been found to be useful when each annular collar comprises an electrode terminal for the supply of heating current, the electrode terminal of the upper annular collar, when viewed circumferentially, being offset relative to the electrode terminal of the lower annular collar.

In the case of only one electrode terminal, maximum power density is achieved within the respective annular collar always in the area of the electrode terminal and the lowest power density is normally found at the side of the annular collar that is furthest away. To achieve a compensation, it has turned out to be of advantage when each annular collar is provided with at least two electrode terminals that are evenly distributed around the annular collar in circumferential direction. Advantageously, the electrode terminals are evenly distributed over the circumference of the annular collar.

Likewise, the maximum power density is also obtained within the contact region between annular collar and heating element, normally in the direct vicinity of an electrode terminal (although the annular collar is provided with a plurality of electrode terminals). For the purpose of compensation, regions of a lower electrical conductivity are formed in a particularly preferred embodiment of the resistance furnace in the annular collar for branching the supplied heating current into at least four, preferably into at least eight, current paths which lead to favored power supply points that are uniformly distributed over the circumference of the heating element.

"Current path" in this context means the distance covered by the heating current from the electrode terminal to the contact region on the heating element. The shorter a current path is, the higher is the current density in the contact region. Desired is, however, a current density that is as uniform as possible on the surrounding contact surface between annular collar and heating element. According to the invention this is achieved by the measure that the heating current fed into the annular collar is branched once or several times, so that at least four current paths are formed. The branching is accomplished by regions which have a lower electrical conductivity than the remaining material of the annular collar. Due to the lower conductivity (which may also be zero), the current flows around said regions substantially such that the current flow can be divided and force-guided. For instance, it is possible with the help of radially extending longitudinal slots in the annular collar to interrupt the "shortest path" from the respective electrode terminal to the contact region. Ideally, the four or more current paths have the same length. The area in which the respective current path ends is here designated as the "most favored power supply point". At any rate, the high electrical conductivity of the annular collar effects an approximately uniform horizontal distribution of the heating current around the regions of lower electrical conductivity. The planar contact region towards the heating element that in consideration of the forced guidance over the current paths has a relatively short distance from the electrode terminal and thus a still increased current density despite an approximately uniform current density distribution is designated as the "most favored power supply point". An embodiment with four favored power supply points will also be designated hereinafter as a "4-point supply", and an embodiment with eight favored power supply points accordingly as an "8-point supply".

Thanks to a uniform distribution of favored power supply points around the circumference of the heating element, a uniform radial current density distribution is achieved around the heating element, which additionally improves the homogeneity of the current and temperature distribution. This measure is in particular positively felt at high heating capacities (above 100 kW).

One embodiment of the resistance furnace of the invention has turned out to be particularly useful wherein, when viewed circumferentially, the favored power supply points of the upper annular collar are offset relative to the power supply points of the lower annular collar. On account of the offset of the lower power supply points to the upper power supply points, the power density curve can be further homogenized vertically (axially), resulting in an improved temperature homogeneity. The offset between the power supply points of the upper and lower annular collar is normally such that a rotational symmetry is obtained relative to the longitudinal axis of the heating tube.

Advantageously, the annular collars are provided with a connection cone matching a conical connection region of the heating element. Thanks to the cone, annular collar and heating tube are self-centered, resulting in a firm fixation so that changes in the contact resistance are avoided during use of the furnace. The annular collar is made integral or is composed of a plurality of components. In particular, the connection cone may be manufactured as a separate component. A more advantageous force distribution is obtained when the connection cone is designed as an inner cone and the connection region of the heating element as an outer cone. The annular collars are here seated with the connection cone on the outer cone of the heating element.

Preferably, the annular collars are provided with a first surrounding cooling channel having a first coolant inlet. Due to cooling the temperature of the annular collars and thus the specific ohmic resistance are kept constant locally and in time.

In this respect it has turned out to be of particular advantage when the annular collars provided next to the first cooling channel and spatially separated therefrom comprise a second surrounding cooling channel with a second coolant inlet, the second inlet, when viewed in circumferential direction, being arranged at the side of the annular collar that is opposite the first inlet. A cooling operation in countercurrent flow is possible by means of the two cooling channels, which contributes to a further homogenization of the horizontal temperature distribution via the annular collars.

In an annular collar which, as has been explained above, is provided with a connection cone, the cooling channel or cooling channels are preferably formed in the area of the connection cone. Said area need not be electrically isolated from the area of the annular collar in which the heating current is branched into the current paths.

Due to their high electrical conductivity, annular collars of copper or of a copper alloy are preferably used. The high conductivity effects a low voltage drop, which facilitates the observance of a homogeneous distribution of the current and power density within the annular collars and thus also in the contact region towards the heating tube.

Preference is given to an embodiment of the resistance furnace according to the invention, wherein the heating element comprises a heating tube of a smaller wall thickness which is extended at both sides by means of at least one contact tube following at the front side and being of a greater wall thickness, each of the annular collars resting on the contact tube.

In this preferred embodiment of the resistance furnace according to the invention, a contact tube is provided between the heating tube proper and the annular collars. The highest temperature is observed in the area of the thin-walled heating tube whereas the contact tube is less heated due to its greater wall thickness and, consequently, the annular collars are also subjected to a smaller temperature load. The risk of a change in the contact resistance due to scaling or oxidation is thereby reduced. The heating tube and the contact tubes next thereto are normally designed as separate components. The contact tubes may be made integral or be composed of several individual parts. It is here essential that the temperature in the area of the contact tubes is smaller than the temperature in the area of the heating tube. To this end, and instead of a greater wall thickness, the contact tubes may also be made from a material of a lower specific resistance than the heating tube. The design of the heating element with contact tubes makes the resistance furnace of the invention well suited for use with high heating capacities.

A further improvement with respect to the homogeneity of the temperature distribution is achieved when a clamping means is provided that comprises a plurality of clamping elements by means of which the contact tubes, the heating tube and the annular collars are axially clamped relative to one another. The clamping means ensures a constant electrical contact between the respective members and minimizes local changes in the contact resistance. Preferably, at least four tension rods that are uniformly distributed over the circumference of the heating element are provided as clamping elements. The rotationally symmetrical arrangement of the tension rods (around the longitudinal axis of the heating element) contributes to a symmetrical current density and temperature distribution in the heating element. The tension rods comprise, for instance, a spring having an exact spring constant, through which a uniform bias can be set in a reproducible and checkable manner.

It has been found to be of particular advantage when a means for gas flushing is provided for introducing a gas flow into the heating element, the means comprising a gas inlet which is branched in at least one branch stage, preferably in at least three branch stages, into a plurality of secondary lines of equal pressure loss, the secondary lines terminating in a plurality of gas outlets which are uniformly distributed over an envelope circle and directed into the furnace chamber.

The gas inlet is branched into at least two secondary lines which, in turn, terminate in a plurality of gas outlets which are uniformly distributed over an envelope circle and directed into the furnace chamber. The gas outlets form a substantially annular cross-section together with a gas shower. The gas flow passes through the heating element in axial direction (in the direction of the vertical longitudinal axis). To achieve a gas flow that is as homogeneous and laminar as possible, the gas pressure applied to the gas outlets should be the same, if possible. This is accomplished when the pressure loss effected by the secondary lines is as identical as possible. The pressure loss is defined by the flow cross-section and by the path of the gas between gas inlet and opening of the respective secondary line. The flow cross-sections and the paths of the secondary lines are thus ideally identical. The greater the number of the branches is, the more homogeneous can the annular gas flushing operation be realized. However, the manufacturing efforts also increase with the number of branches. An optimum compromise is achieved in the case of three branches. The above-described gas shower is just as well suited for use in combination with a resistance furnace of the invention as for use in combination with an induction furnace.

In this respect it has been found to be of particular advantage when the gas outlets are formed in a flush ring which is arranged above the upper annular collar and is composed of at least two, preferably at least four, separate circular segments, the secondary lines each terminating in one of the circular segments. Four circular segments are obtained when the gas inlet is branched twice into first two and then four secondary lines. The secondary lines preferably terminate mid-way in a respective one of the circular segments, resulting in a further branching of the gas flow. The segments forming the flush ring are positioned on the above-mentioned envelope circle. The gas pressure applied in front of the gas outlets within the circular segments is substantially identical; because of the branches, this is due to the fact that the flush gas covers approximately the same distance from the gas inlet to the gas outlets. A preferred development of the resistance furnace according to the invention is characterized in that the heating element is surrounded by a protective jacket of a controllable temperature whose outer wall has detachably secured thereto cooling plates within which a cooling liquid is flowing.

Cooling plates are detachably secured to the outer wall of the protective jacket, a cooling liquid flowing within the cooling plates. The cooling plates are connected to a separate supply means for the cooling liquid, or it is also possible to connect a plurality of cooling plates in series or in parallel for supplying cooling liquid. The temperature distribution within the heating element can also be varied by means of the cooling plates, a locally different temperature control of the protective jacket being also possible. The detachable connection of the cooling plates with the protective jacket guarantees a simple exchange.

It has been found to be of advantage when the interior of the heating element is sealed to the outside by means of quartz wool. Quartz wool is characterized by a high temperature resistance. In case the resistance furnace is used for heating quartz glass bodies, quartz wool is a material of the same type. Quartz wool may be cleaned beforehand, e.g. by chemical etching or hot chlorination. A further improvement will be achieved when the quartz wool consists of synthetically produced $SiO_2$.

BRIEF DESCRIPTION OF THE DRAWINGS

The invention shall now be explained with reference to an embodiment and a drawing. The drawing is a schematic illustration showing in detail in.

DETAILED DESCRIPTION

Figure 1:
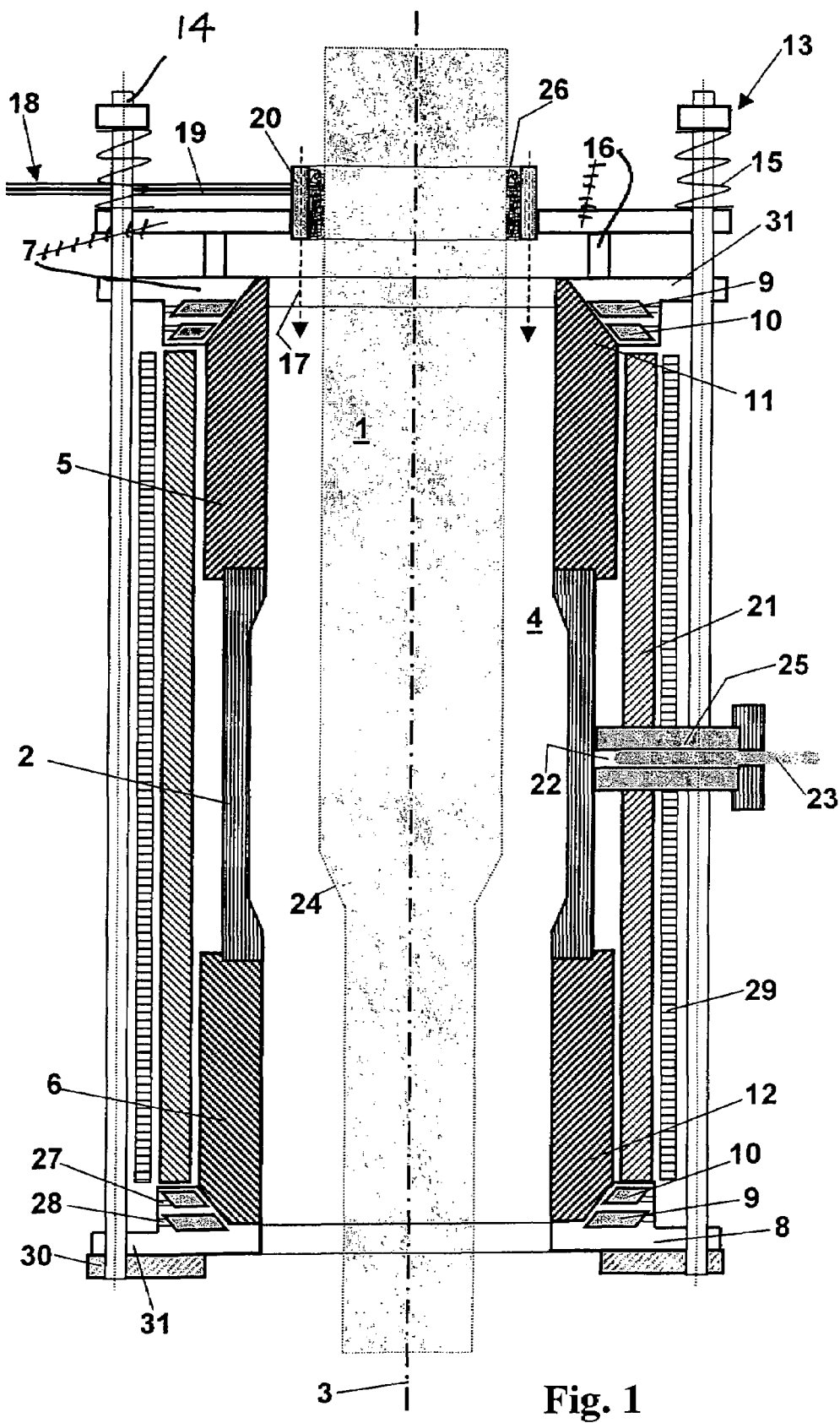
FIG. 1 an embodiment of a resistance furnace according to the invention in a side view.

The resistance furnace according to the invention as shown in FIG. 1 is used for heating and elongating a cylinder 1 of quartz glass. This furnace is a high-performance furnace having a maximum heating capacity of 700 kW. The resistance furnace comprises a heating tube 2 of graphite with a vertically oriented longitudinal axis 3, the heating tube enclosing a heating chamber 4.

Contact tubes 5; 6 are positioned on the heating tube 2 at both sides at the front. The contact tubes 5; 6 are also made from graphite and have a greater wall thickness than the heating tube 2.

Heating current is introduced into the heating tube 2 via annular collars 7; 8 consisting of a copper alloy CuCrZr, an upper annular collar 7 resting on the upper side 11 of the upper contact tube 5 and a lower annular collar 8 on the lower side 12 of the lower contact tube 6. The annular collars 7; 8 comprise outwardly projecting flanges 31 which have provided therein through holes each extending radially over part of the circumference of the annular collars 7; 8 and used for branching the heating current supplied to the annular collars 7; 8 into eight current paths of approximately the same length, resulting in an 8-point supply. The shape and function of the annular collars 7; 8 will be described in this respect in more detail further below with reference to FIG. 2.

Each of the annular collars 7; 8 is provided with two surrounding cooling channels 9; 10 which extend in neighboring relationship with each other and by which water is guided in countercurrent flow for cooling the annular collars 7; 8. With the help of this water cooling, the temperature of the annular collars 7; 8—and thus the specific resistance—is kept constant locally and in time. The cooling water inlet 27 of the one cooling channel 9 is opposite the cooling water inlet 28 of the other cooling channel 10. With the help of the two cooling channels 9; 10 it is possible to cool the annular collars 7; 8 in countercurrent flow, which contributes to a further homogenization of the horizontal temperature distribution via the annular collars 7; 8.

For fixing the annular collars 7; 8 onto the contact tubes 5; 6, upper side 11 of the upper contact tube 5 and lower side 12 of the lower contact tube 6 are provided with a surrounding outer cone which matches an inner cone of the respectively assigned annular collar 7; 8.

Heating tube 2, contact tubes 5; 6 and annular collars 7; 8 are clamped relative to one another by means of a clamping device 13. The clamping device 13 comprises four tension rods 14 that are evenly distributed over the circumference of the heating tube 2 and connected to a bottom plate 30. Said tension rods are each provided with an adjustable clamping spring 15 of a defined spring constant by means of which said furnace members (2; 5; 6; 7; 8) are pressed via spacers 16 at a predetermined and measurable pressing force onto one another, the rotationally symmetrical distribution of the tension rods 14 also effecting a symmetry of the compressive stress distribution, which has an advantageous effect on the homogeneous distribution of current density and temperature within the heating tube.

For the introduction of a flush gas flow (directional arrows 17) into the furnace chamber 4, a flush gas ring 18 is arranged above the upper annular collar 7 and is provided on its circumference with gas outlets directed into the furnace chamber 4. The flush gas ring 18 consists of four separate circular segments, a secondary line 20 branched from a gas inlet 19 terminating in each of said segments. Details regarding the construction and function of the flush gas ring 18 will be described further below with reference to FIG. 3.

For the purpose of heat shielding the heating tube 2 and the contact tubes 5; 6 are surrounded by a furnace jacket 21 of a controllable temperature with cooling plates 29 being screwed in segments onto the outer jacket thereof. A cooling liquid flows through the cooling plates 29, the cooling circuits of the cooling plates 29 being separated from one another, so that the furnace jacket may have locally different temperatures. To prevent the withdrawal of heat from the furnace chamber 4, a gap is provided between the cooling plates 29 and the furnace jacket 21, so that the cooling plates 29 do not directly rest on the furnace jacket 21.

The furnace jacket 21 is provided in the center with a through hole 22 through which the temperature of the heating tube 2 is measured by means of an optical waveguide 23. With the help of the optical waveguide 23, the temperature measurement signal is transmitted to a measuring device. The measuring device can thus be so far away from the heating tube 2 that a cooling operation is not needed for the protection of the measuring device.

The gap between the secondary lines 20 of the flush ring 18 and the quartz glass cylinder 1 is sealed by means of purified quartz wool 26.

Figure 2:
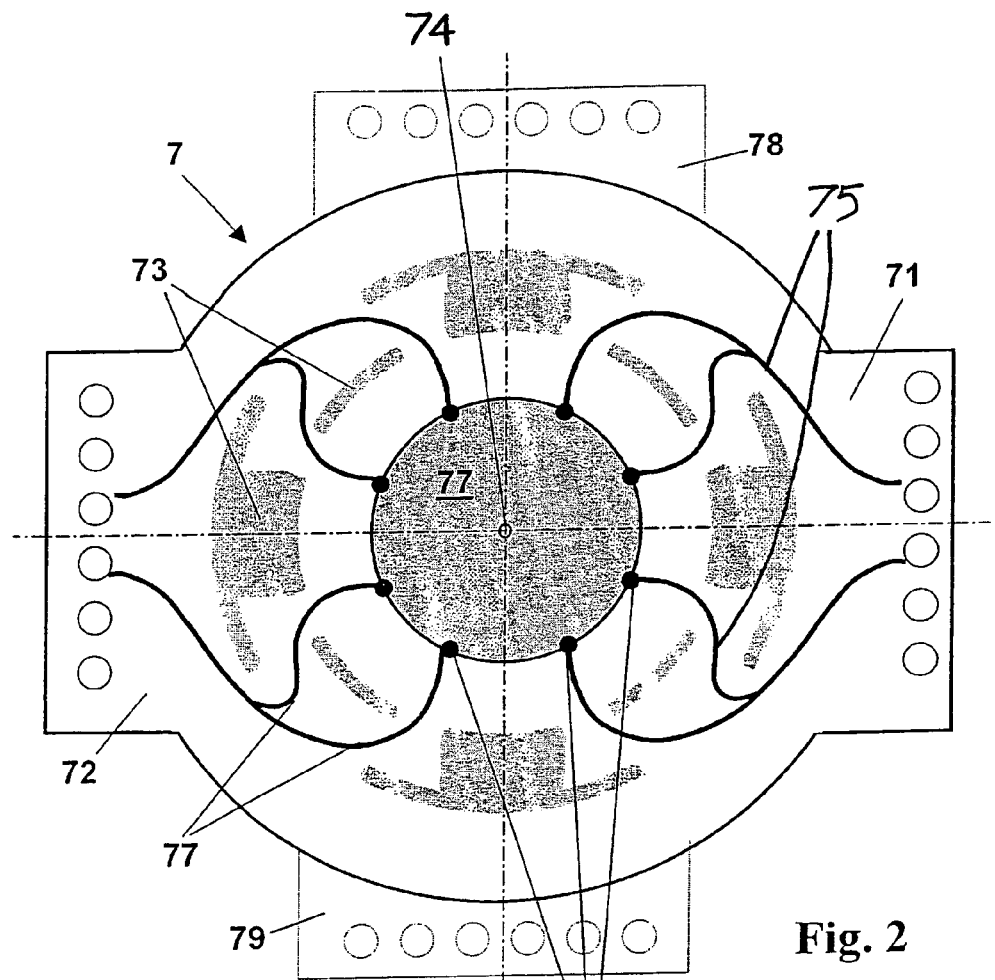
FIG. 2 an embodiment of an annular collar for supplying heating current into a heating tube by means of an 8-point supply, in a top view.

FIG. 2 is a schematic illustration showing the upper annular collar 7 in a top view. The annular collar 7 consists of a substantially ring-like copper disk which is provided with two electrode terminals 71; 72 (terminal tabs) which are opposite each other on the outer circumference and via which the heating current is fed into the annular collar 7. The electrode terminals 71; 72 are fed by a joint power source (not shown in the figure). The annular collar 7 is provided with a plurality of through holes 73 which extend radially around part of the circumference and are distributed in symmetry around the central axis 74 (corresponding to the longitudinal axis 3). The through holes 73 are here formed in the area of the flange 31 and arranged such that the heating current supplied by the electrode terminals 71; 72 is branched into eight current paths of equal length, symbolized by directional arrows 75, and thereby guided to "favored supply points" 76 in the area of the inner hole 77 with which the annular collar 7 rests on the contact tube 5 (see FIG. 1). Thanks to the two electrode terminals 71, 72 and the distribution and size of the through holes 73, the heating current is distributed in the annular collar 7 according to FIG. 2 over a total of eight favored supply points 76 ("8-point supply"). In comparison with an embodiment of the annular collar with only one "favored supply point", this results in a more uniform current density distribution in the area of the inner hole 77 and thus to a homogeneous horizontal distribution of the current density in the area of the contact tube 5 and thus also of the heating tube 2.

A further homogenization of the current density distribution in the heating tube 2 is achieved by the measure that the electrode terminals 71; 72 of the upper annular collar 7 are offset by 90° relative to the electrode terminals 78; 79 of the lower annular collar 8 (see FIG. 1), as is schematically outlined in FIG. 2. The lower annular collar 8 is also optimized for an "8-point supply" of the heating current, so that the offset arrangement of the annular collars 7; 8 also results in an offset of the "favored power supply points" by 90° and in rotational symmetry with respect to the central axis 74. This results in a uniform vertical current density distribution within the heating tube 2, which additionally contributes to an improved homogeneity of the current and temperature distribution.

Figure 3:
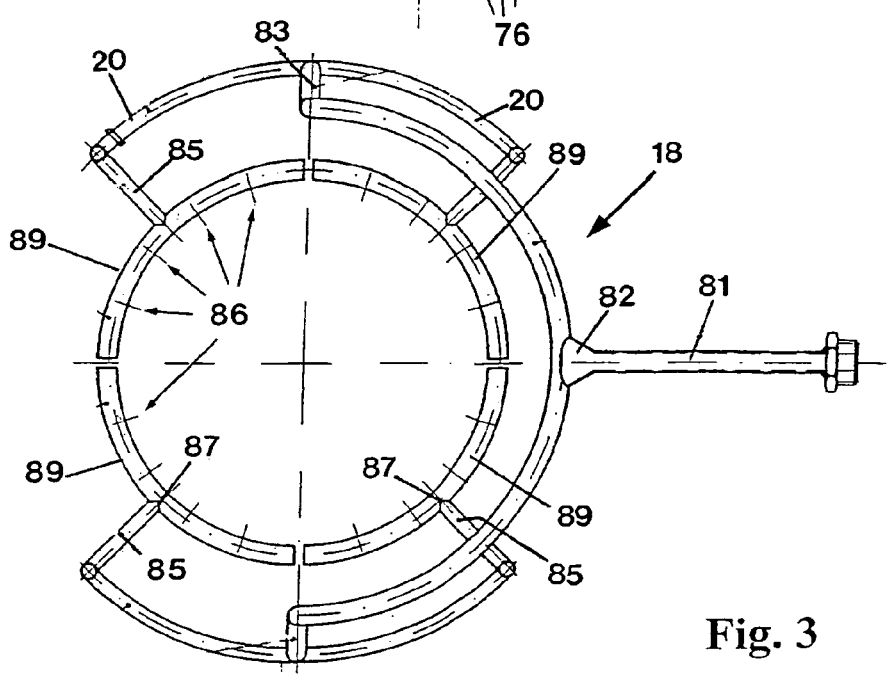
FIG. 3 an embodiment of a flush ring for producing a laminar flush gas flow in the shape of an annular gap, in a top view.

To avoid the entry of oxygen into the furnace chamber 4, said chamber is flushed with nitrogen during the drawing process. To this end a flush ring 18 (FIG. 1) is used, as shown in FIG. 3. The flush ring 18 consists of interconnected copper tubes forming a gas inlet nozzle 81 branched in two branch stages 82; 83 into a total of four secondary lines 20. Each of the secondary lines 20 centrally terminates—under formation of a third branch stage 85—in an annular segment 89 which is provided with a plurality of gas outlets 86. The gas outlets 85 of the annular segments 89 are positioned on an envelope circle smaller than the inner diameter of the heating tube 2. The gas outlets 85 jointly form a gas shower of a substantially annular cross-section. The nitrogen flow, starting from the gas outlets 86, passes through the heating tube 2 towards the longitudinal axis 3 from the top to the bottom. To obtain a nitrogen flow that is as homogeneous and laminar as possible, a gas pressure that is the same, if possible, is desired at the gas outlets 8. This is accomplished in that all secondary lines 20 have the same length and the same inner diameter and that the distance between the first branch stage 82 and the opening 87 in the respective annular segment 89 is the same for all secondary lines 20.

What is claimed is:

1. A resistance furnace comprising: a tubular heating element having a vertically oriented longitudinal axis, said heating element having a shell surface defined by an upper side and a lower side and surrounding a furnace chamber, and being connected to at least two supply terminals by means of which heating current is introduced at power supply points into said heating element, wherein said supply terminals comprise a surrounding upper annular collar adjacent said upper side and a surrounding lower annular collar adjacent said lower side, wherein regions of lower electrical conductivity are formed in said annular collars for branching the supplied heating current into at least four current paths leading to favored power supply points uniformly distributed over a circumference of said heating element, and wherein said power supply points of said upper annular collar are offset circumferentially relative to said power supply points of said lower annular collar.

2. A resistance furnace comprising: a tubular heating element having a vertically oriented longitudinal axis, said heating element having a shell surface defined by an upper side and a lower side and surrounding a furnace chamber, and being connected to at least two supply terminals by means of which heating current is introduced at power supply points into said heating element, wherein said supply terminals comprise a surrounding upper annular collar adjacent said upper side and a surrounding lower annular collar adjacent said lower side, and wherein each of said annular collars comprises an electrode terminal feeding said heating current, and wherein said electrode terminal of said upper annular collar is offset circumferentially relative to said electrode terminal of said lower annular collar.

3. The resistance furnace according to claim 2, wherein each of said annular collars is provided with at least two electrode terminals uniformly distributed circumferentially around said annular collar.

4. The resistance furnace according to claim 2 wherein regions of lower electrical conductivity are formed in said annular collars for branching the supplied heating current into at least four current paths leading to favored power supply points uniformly distributed over a circumference of said heating element.

5. The resistance furnace according to claim 2 wherein said heating element comprises a heating tube having a wall thickness, said heating tube being extended at both sides by means of at least one contact tube having a front side following a front side of the heating tube and having a greater wall thickness, each of said annular collars being supported on said contact tube.

6. The resistance furnace according to claim 5, wherein there is provided a clamping means which comprises a plurality of clamping elements by means of which said contact tubes, said heating tube and said annular collars are axially clamped relative to one another.

7. The resistance furnace according to claim 6, wherein at least four tension rods which are uniformly distributed over a circumference of said heating element are provided as clamping elements.

8. The resistance furnace according to claim 2 wherein regions of lower electrical conductivity are formed in said annular collar for branching the supplied heating current into at least eight current paths leading to favored power supply points uniformly distributed over a circumference of said heating element.

9. The resistance furnace according to claim 2 wherein said annular collars each comprise a connection cone matching a respective conical connection region of said heating element.

10. The resistance furnace according to claim 3 wherein said annular collars each comprise a connection cone matching a respective conical connection region of said heating element.

11. The resistance furnace according to claim 4 wherein said annular collars each comprise a connection cone matching a respective conical connection region of said heating element.

12. The resistance furnace according to claim 2 wherein said annular collars have a first surrounding cooling channel having a first coolant inlet.

13. The resistance furnace according to claim 3 wherein said annular collars have a first surrounding cooling channel having a first coolant inlet.

14. The resistance furnace according to claim 9, wherein said connection cone is an inner cone and the connection region of said heating element is an outer cone.

15. The resistance furnace according to claim 12, wherein said annular collars have a second surrounding cooling channel adjacent said first cooling channel and spatially separated therefrom, said second surrounding cooling channel having a second coolant inlet, said second coolant inlet arranged at a side of said annular collar circumferentially opposite said first inlet.

16. The resistance furnace according to claim 2 wherein said heating element is surrounded by a protective jacket of a controllable temperature whose outer wall has detachably secured thereto cooling plates within which a cooling liquid is flowing.

17. A resistance furnace comprising: a tubular heating element having a vertically oriented longitudinal axis, said heating element having a shell surface defined by an upper side and a lower side and surrounding a furnace chamber, and being connected to at least two supply terminals by means of which heating current is introduced at power supply points into said heating element, wherein said supply terminals comprise a surrounding upper annular collar adjacent said upper side and a surrounding lower annular collar adjacent said lower side, and wherein the heating element has an outside and an interior, and the interior of said heating element is sealed to the outside by means of quartz wool.

18. The resistance furnace according to claim 17, wherein said quartz wool consists of synthetically produced $SiO_2$.

19. A resistance furnace comprising: a tubular heating element having a vertically oriented longitudinal axis, said heating element having a shell surface defined by an upper side and a lower side and surrounding a furnace chamber, and being connected to at least two supply terminals by means of which heating current is introduced at power supply points into said heating element, wherein said supply terminals comprise a surrounding upper annular collar adjacent said upper side and a surrounding lower annular collar adjacent said lower side, and wherein gas flushing is provided by a system which comprises a gas inlet which is branched in at least one branch stage, into a plurality of secondary lines of equal pressure loss, said secondary lines terminating in a plurality of gas outlets which are uniformly distributed over an envelope circle and directed into said furnace chamber.

20. The resistance furnace according to claim 19, wherein said gas outlets are formed in a flush ring which is arranged above said upper annular collar and is composed of at least two separate circular segments, said secondary lines each terminating in one of said circular segments.

21. The resistance furnace according to claim 19, wherein said gas outlets are formed in a flush ring which is arranged above said upper annular collar and is composed of at least four separate circular segments, said secondary lines each terminating in one of said circular segments.

22. The resistance furnace according to claim 19 wherein said gas inlet is branched in at least three branch stages, into said plurality of secondary lines of equal pressure loss.

23. The resistance furnace according to claim 1 wherein said annular collars each comprise a connection cone matching a respective conical connection region of said heating element.

24. The resistance furnace according to claim 1 wherein said annular collars have a first surrounding cooling channel having a first coolant inlet.

25. The resistance furnace according to claim 2 wherein said annular collars consist of copper or a copper alloy.

26. The resistance furnace according to claim 3 wherein said annular collars consist of copper or a copper alloy.

27. The resistance furnace according to claim 4 wherein said annular collars consist of copper or a copper alloy.

28. The resistance furnace according to claim 1 wherein said annular collars consist of copper or a copper alloy.

29. The resistance furnace according to claim 5 wherein said heating element is surrounded by a protective jacket of a controllable temperature whose outer wall has detachably secured thereto cooling plates within which a cooling liquid is flowing.

30. The resistance furnace according to claim 6 wherein said heating element is surrounded by a protective jacket of a controllable temperature whose outer wall has detachably secured thereto cooling plates within which a cooling liquid is flowing.

31. The resistance furnace according to claim 7 wherein said heating element is surrounded by a protective jacket of a controllable temperature whose outer wall has detachably secured thereto cooling plates within which a cooling liquid is flowing.

32. The resistance furnace according to claim 1 wherein said annular collars have a first surrounding cooling channel having a first coolant inlet.

33. The resistance furnace according to claim 32, wherein said annular collars have a second surrounding cooling channel adjacent said first cooling channel and spatially separated therefrom, said second surrounding cooling channel having a second coolant inlet, said second coolant inlet arranged at a side of said annular collar circumferentially opposite said first inlet.

34. The resistance furnace according to claim 1 wherein said heating element comprises a heating tube having a wall thickness, said heating tube being extended at both sides by means of at least one contact tube having a front side following a front side of the heating tube and having a greater wall thickness, each of said annular collars being supported on said contact tube.

35. The resistance furnace according to claim 34, wherein there is provided a clamping means which comprises a plurality of clamping elements by means of which said contact tubes, said heating tube and said annular collars are axially clamped relative to one another.

36. The resistance furnace according to claim 35, wherein at least four tension rods which are uniformly distributed over a circumference of said heating element are provided as clamping elements.

37. The resistance furnace according to claim 1 wherein said heating element is surrounded by a protective jacket of a controllable temperature whose outer wall has detachably secured thereto cooling plates within which a cooling liquid is flowing.

38. The resistance furnace according to claim 1 wherein regions of lower electrical conductivity are formed in said annular collar for branching the supplied heating current into at least eight current paths leading to favored power supply points uniformly distributed over a circumference of said heating element.

39. The resistance furnace according to claim 17 wherein said heating element comprises a heating tube having a wall thickness, said heating tube being extended at both sides by means of at least one contact tube having a front side following a front side of the heating tube and having a greater wall thickness, each of said annular collars being supported on said contact tube.

40. The resistance furnace according to claim 39, wherein there is provided a clamping means which comprises a plurality of clamping elements by means of which said contact tubes, said heating tube and said annular collars are axially clamped relative to one another.

41. The resistance furnace according to claim 40, wherein at least four tension rods which are uniformly distributed over a circumference of said heating element are provided as clamping elements.

42. A resistance furnace comprising: a tubular heating element having a vertically oriented longitudinal axis, said heating element having a shell surface defined by an upper side and a lower side and surrounding a furnace chamber, and being connected to at least two supply terminals by means of which heating current is introduced at power supply points into said heating element, wherein said supply terminals comprise a surrounding upper annular collar adjacent said upper side and a surrounding lower annular collar adjacent said lower side, and wherein regions of lower electrical conductivity are formed in said annular collars for branching the supplied heating current into at least four current paths leading to favored power supply points uniformly distributed over a circumference of said heating element, and wherein said annular collars have a first surrounding cooling channel having a first coolant inlet.

* * * * *